(12) United States Patent
Conner et al.

(10) Patent No.: US 7,257,494 B2
(45) Date of Patent: Aug. 14, 2007

(54) INTER-PROCESS SENSING OF WAFER OUTCOME

(75) Inventors: William T. Conner, Natick, MA (US); Craig Garvin, Somerville, NY (US); Steven J. Lakeman, Newbury Park, CA (US); Igor Tepermeister, Waban, MA (US); Chenglong Yang, San Jose, CA (US)

(73) Assignee: Inficon, Inc., East Syracuse, NY (US)

( * ) Notice: Subject to any disclaimer, the term of this patent is extended or adjusted under 35 U.S.C. 154(b) by 0 days.

(21) Appl. No.: 11/126,471

(22) Filed: May 11, 2005

(65) Prior Publication Data

US 2005/0256653 A1     Nov. 17, 2005

Related U.S. Application Data

(60) Provisional application No. 60/570,382, filed on May 12, 2004.

(51) Int. Cl.
*G06F 19/00* (2006.01)
*G01L 21/66* (2006.01)

(52) U.S. Cl. .......................... 702/33; 702/81; 700/121; 438/14

(58) Field of Classification Search ................. 702/30, 702/32, 33, 188, 81; 700/117, 121; 438/6, 438/14, 17; 73/1.63
See application file for complete search history.

(56) References Cited

U.S. PATENT DOCUMENTS

| | | | |
|---|---|---|---|
| 6,251,195 B1 * | 6/2001 | Wagener et al. | 134/7 |
| 6,279,373 B1 * | 8/2001 | Kenney et al. | 73/1.63 |
| 2003/0033676 A1 * | 2/2003 | DeYoung et al. | 8/158 |

FOREIGN PATENT DOCUMENTS

| | | |
|---|---|---|
| JP | 62094930 | 5/1987 |
| JP | 10204642 | 8/1998 |
| JP | 2003100620 | 4/2003 |

* cited by examiner

*Primary Examiner*—Bryan Bui
(74) *Attorney, Agent, or Firm*—Marjama & Bilinski LLP

(57) ABSTRACT

A method of monitoring a microelectronic manufacturing process includes the implementation of a monitoring sensor that is configured to operate in an inter-process mode. During an inter-process mode, a first valve is opened in order to initiate transfer of a processing substrate between at least one processing chamber and a transfer chamber. The monitoring sensor is programmed to monitor the interior of the at least one processing chamber only after the first valve is opened.

14 Claims, 3 Drawing Sheets

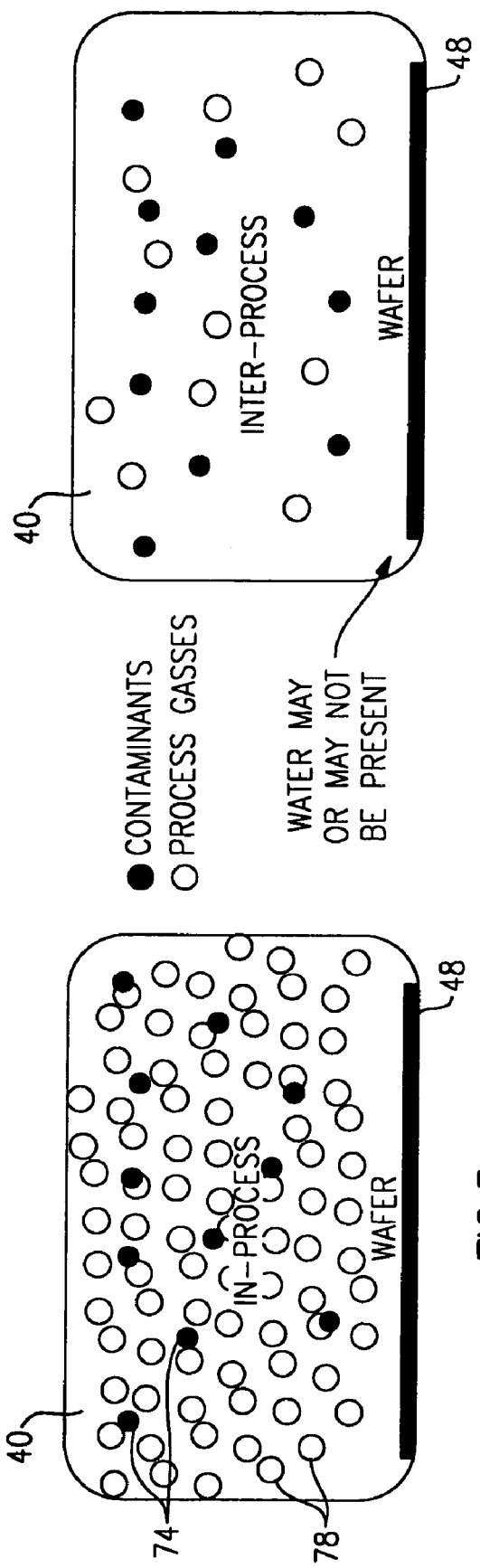

INTER-PROCESS SENSING OF WAFER OUTCOME

This patent application is based upon a provisional patent application, U.S. Ser. No. 60/570,382, filed May 12, 2004 and entitled: INTER-PROCESS SENSING OF WAFER OUTCOME, the entire contents of which are herein incorporated by reference.

FIELD OF THE INVENTION

The invention relates to the field of semiconductor process monitoring, and in particular to a method of inter-process sensing for determining process information.

BACKGROUND OF THE INVENTION

The importance of monitoring individual steps performed during the semiconductor manufacturing process is well established. To date, the two options that have been available for monitoring these processes have been ex situ metrology; process monitoring performed after the wafer has been processed, or in situ sensing, monitoring the process while the wafer is being processed.

Although adequate results can be achieved by ex situ metrology alone, the limitations of this latter approach are twofold. First, ex situ metrology is often a throughput-limiting step. As a result, a sampling schedule is used, and therefore not every processed wafer is measured. This limits the ability to detect manufacturing flaws, and also allows flawed product to move to subsequent processing steps. A worse case scenario is that any flaw can only be detected in final test, therefore resulting in maximum waste. Second, some ex situ metrology measurements, such as, for example, electrical test, require additional process steps before the test can be performed. Inherent to these measurements is the risk of performing additional work on a flawed part.

Although not as accurate, in situ sensing offers the advantage of a fast measurement that provides information about the process step of interest, or a very recent process step. In situ sensing can almost always be performed on every processed wafer with no loss of throughput. In addition, in situ sensing can diagnose the step it is sensing without the requirement for subsequent steps to be performed. A limitation of in situ sensing, however, is that it is not a direct measurement of wafer outcome. Rather, process conditions are sensed, and the impact on wafer outcome and device performance is inferred via physical, phenomenological, or empirical modeling.

Numerous analytical instruments exist to sense a wide range of compounds that are relevant to microelectronics manufacturing. However, far fewer sensors capable of withstanding the processing environment are available.

SUMMARY OF THE INVENTION

According to one aspect of the present invention, there is provided a method for monitoring a semiconductor substrate manufacturing process on a processing apparatus, the apparatus including at least one process chamber, and a transfer chamber interconnected to said at least one process chamber, the method comprising the steps of providing a monitoring sensor in relation to the at least one process chamber, opening a first valve to initiate transfer of a processing substrate between the at least one process chamber and the transfer chamber, and permitting the sensor to monitor the interior of the at least one process chamber only after the first valve has been opened.

According to one version, the monitoring sensor is connected to the at least one process chamber by means of a second valve, the second valve being opened to permit the monitoring sensor to monitor the interior of the at least one process chamber after the first valve has been opened. According to another version, an orifice is provided between the interior of the at least one process chamber and the transfer chamber wherein the size of the orifice is changed from a smaller size when the first valve is not opened to a larger size after the first valve has been opened.

According to yet another version, the monitoring sensor is interconnected to the interior of the at least one process chamber but the monitoring sensor is not powered until the first valve is opened.

In accordance with the method, the monitoring sensor can be permitted to monitor the interior of the at least one process chamber at various points of a process (inter-process) including just prior to transferring a substrate (processing wafer) to the chamber, just after transferring a wafer to the confines of the process chamber, and between applications of various layers onto the substrate, allowing for reconfiguring of the process chamber based on results obtained by the monitoring sensor.

According to another aspect of the present invention, there is provided a processing apparatus comprising a transfer chamber, at least one process chamber interconnected to said transfer chamber by a first valve, said process chamber being capable of receiving reactant gases for forming a deposition reaction and at least one processing substrate transferred between the at least one process chamber and the transfer chamber. The apparatus further includes a monitoring sensor that is interconnected to the interior of the at least one process chamber wherein the apparatus is configured to permit the monitoring sensor to operate only after the first valve has been opened.

The following invention presents a novel approach to rapidly obtaining process information, referred to throughout as inter-process sensing. Inter-process sensing provides at least two advantages. First, this type of sensing allows the benefits of in situ sensing to be preserved under conditions where in situ sensing is not typically possible. The second realized advantage is that better sensitivity is afforded to key process parameters under certain circumstances.

It is believed that inter-process sensing as described herein according to the present invention is a viable (in some cases preferable) way to determine wafer process conditions and thereby infer wafer outcome. Inter-process sensing is generally performed in a less aggressive chemical and physical environment than exists during wafer processing. This distinction is important because the process environment is often detrimental to the sensor. Additionally, the quantity of interest is often not the dominant process constituent, but rather by-products and contaminants. In many cases, process monitoring sensors are limited to making relative measurements, i.e., sensors can detect lower absolute levels, if the background level is lower. In these cases, inter-process conditions can result in improved sensitivity. Another advantage of inter-process operation is that it allows a monitoring sensor to operate reliably in an application that provides a hostile environment during normal wafer processing.

Other features and advantages will become readily apparent from the following Detailed Description which should be read in conjunction with the accompanying drawings.

BRIEF DESCRIPTION OF THE DRAWINGS

FIGS. 3 and 4 pictorially depict comparisons of the environmental difference s in a process chamber between an in-process and an inter process configuration.

DETAILED DESCRIPTION

Figure 1A:
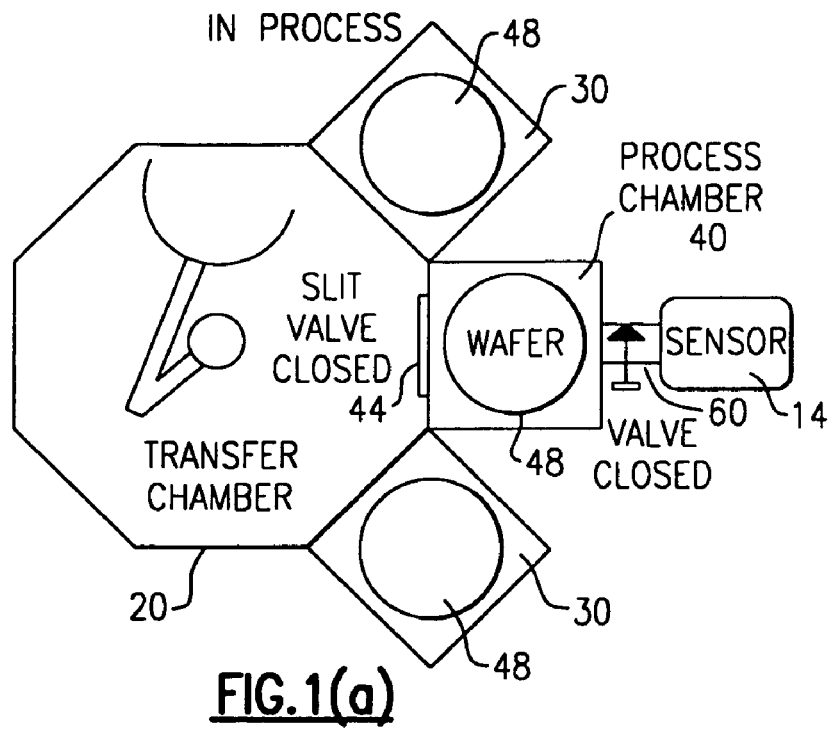
FIGS. 1(a) and 1(b) depict the operation of a vacuum processing cluster tool, including a process monitoring sensor that is configured in accordance with an embodiment of the present invention.
Figure 1B:
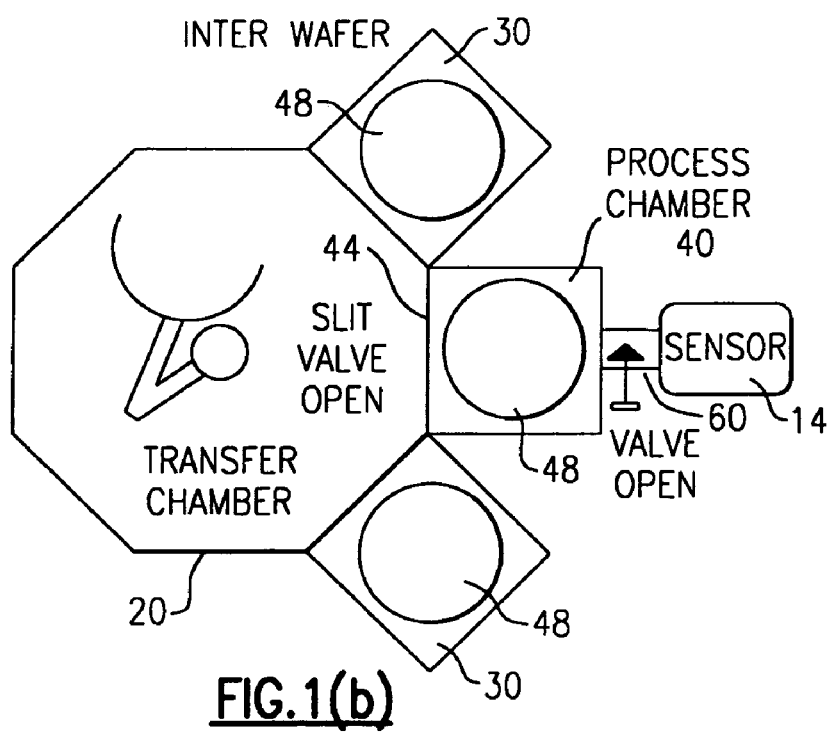

Turning to the figures, FIGS. 1(a) and 1(b) each illustrate the typical operation of a microelectronics vacuum processing cluster tool 10, along with a sensor 14 that is disposed in relation thereto for inter-process operation in accordance with a first embodiment of the present invention.

The herein-depicted cluster tool 10 includes a transfer chamber 20 as well as a number of adjacent process chambers 30, 40. For purposes of this embodiment, only a single process chamber 40 is discussed. Each of the remaining process chambers 30, however, can be similarly equipped in accordance with the following discussion. The process chamber 40 and the transfer chamber 20 are separated from one another by means of a slit valve 44, which allows the two chambers to be at different pressures. In normal operation, the slit valve 44 closes once a wafer 48 to be processed has moved to one of the process chambers 40. In almost all processing steps, the pressure within the process chamber 30 is significantly higher than that of the transfer chamber 20. Once the process has ended, the slit valve 44 is opened, allowing both the removal of the processed wafer 48 through the transfer chamber 20, as well as permitting the pressure of the process chamber 40 to drop to that of the transfer chamber 20.

The high pressure during process limits the type of sensors that can be used. One solution to this problem in accordance with the present invention is to use a valve 60 in order to isolate the sensor 14 from the process chamber 40 during the process, as illustrated in FIGS. 1(a) and 1(b). The valve 60 isolating the sensor 14 is programmed by the control software of the tool to open shortly after or substantially at the same time that the slit valve 44 is opened. The result is that the sensor 14 is exposed to lower pressures, lower concentrations of reactive gases and, significantly, the latter stage of the process. The choice of valves used in isolating the sensor 14 can of course include mechanical and/or pneumatic valves or can include other suitable types. In passing, it should be noted that the throughput of the cluster tool and the anticipated lifetime of the valve that is used between the process chamber 40 and the sensor 14 may dictate whether the valve 60 should be closed for each processed wafer 48.

Figure 2A:
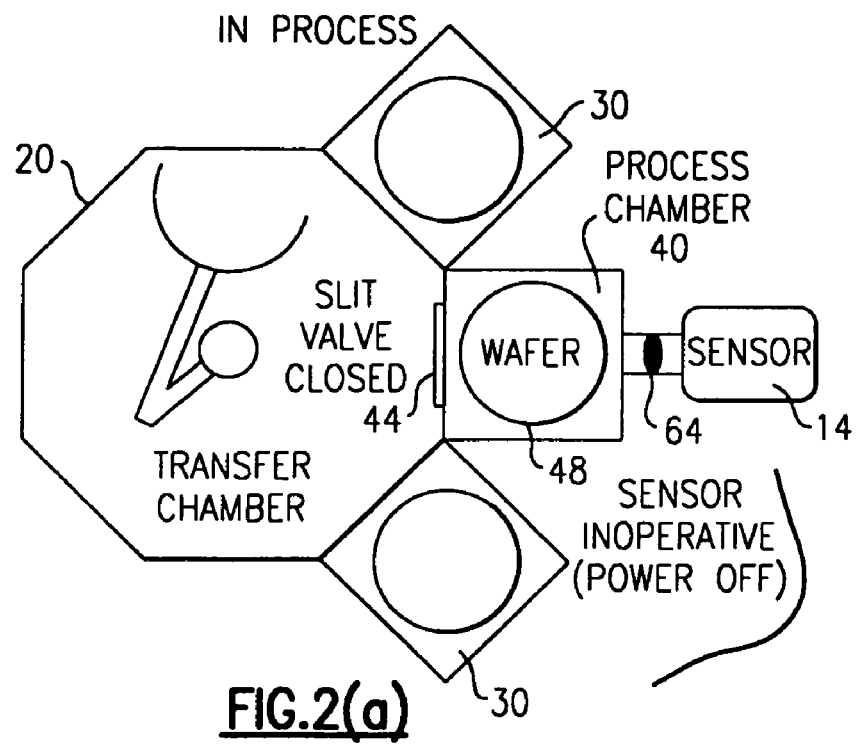
FIGS. 2(a) and 2(b) depict an alternative tool/monitoring sensor implementation to that shown in FIGS. 1(a) and 1(b)
Figure 2B:
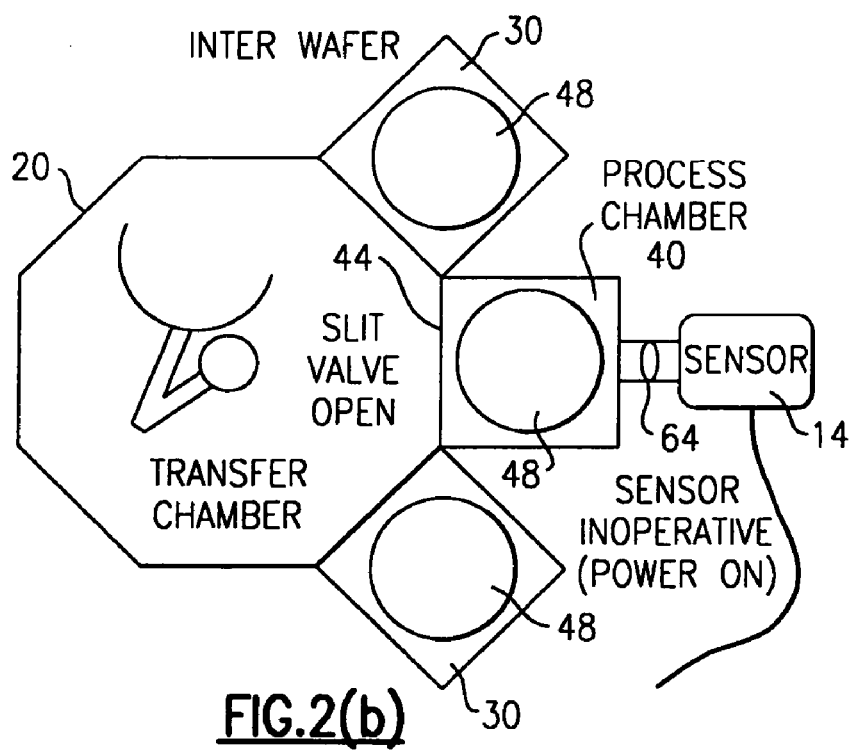

An alternative embodiment in accordance with the present invention is shown in FIGS. 2(a) and 2(b). Similar parts are labeled with the same reference numerals for the sake of clarity. As in the preceding, a cluster tool 10 is utilized having a Transfer chamber 20 and a plurality of process chambers 30, 30, 40. A slit valve 44 separates the process chambers from the transfer chamber 20, the valve being closed at the time a wafer (substrate) has been moved to one of the process chambers 20 and opened at the time the processing is complete in order to permit the removal of the processed wafer from the process chamber, as well as to normalize the pressure within the adjacent chambers. In this present embodiment, a processing sensor 14 is also disposed in relation to the process chamber 40 and is mounted such that the sensor is exposed to the contents of the process chamber rather than being separated therefrom by valving, as in the preceding embodiment. However, the apparatus according to this embodiment is interconnected to the processing sensor 14 such that the sensor is simply powered down during the process, as shown in FIG. 2(a), which offers sufficient protection, with the sensor being made operational only at the time the slit valve 44 is opened. More particularly, the powering up of the sensor 14 is programmed to commence shortly after or substantially at the same time that the slit valve 44 is opened.

Another alternative method for protecting the sensor 14 from the environment of the process is through selective modification of the size of the orifice 64 provided between the process chamber 40 and the sensor 14. More particularly, the diameter (size) of the orifice is deliberately downsized to create a smaller sized orifice or eliminated during the process with the size of the orifice being made larger or expanded following the opening of the slit-valve 44 (e.g., inter-process). A number of various techniques can be used to perform the steps of expanding and shrinking the orifice, as needed.

By limiting pressure and contamination, a more sensitive analytical instrument can be used with more accurate results. Depending on the device characteristic of interest, inter-process sensing in accordance with the present invention may be more suited to the task than in situ metrology. The process chamber 10 typically maintains pressure by flowing gas into the chamber and regulating its exhaust with a variably throttled pump. As a result, there is significant gas throughput and the sensor is often exposed to the late stages of the process. It has been determined that conditions during the late stages of the process are disproportionately important to film surface characteristics. Properties, such as reflectivity, are a very strong function of conditions during the final stages of film processing, and much less a function of the average performance during the process.

FIGS. 3 and 4 illustrate depict comparatively, a performance motivation for inter-process sensing as taught by the present invention. As seen in these figures, the quantities of interest for detection found are often not the process gasses and the chemical by-products they generate. Rather, chamber-based and wafer-based contaminants are often the focus of interest. The reason for this focus is simple. Often, process gas concentrations are very well controlled, and process variations are due to contamination, either on the incoming wafer 48, or built up upon the walls of the process chamber 40. As illustrated in FIG. 3, these contaminants 74 outgas at a relatively constant rate, and achieve relatively constant absolute concentration. However, the relative concentration drops very significantly once process gases 78 are added. Many sensors, such as residual gas analyzers such as the Transpector Gas Analysis System manufactured by Inficon, Inc., have limits to their relative rather than absolute sensitivity. As a result, these sensors have better detection capability for contaminants when operated on an inter-process basis, after the process gases have been drawn from the process chamber, rather than while in-process (in situ metrology).

With the performance advantage of inter-process sensing having been established by the preceding, the following notes at least four different examples through which inter-process sensing can be employed for purposes of the present invention. Other means or examples will become apparent to one of sufficient skill in the field.

First, an inter-process sensing measurement using the sensor 14 can be made according to any of the alternative methods described above in regard to FIGS. 1(a)-2(b), immediately after the process has completed and related to the just-completed wafers' characteristics. This configuration is most likely to capture those characteristics that are related to the final processing of the wafer, such as, for example, deposited layer reflectivity or etched profile. In these cases, it makes sense that the conditions at the end of the process step would contribute most significantly to the inter-process measurement.

Second, an inter-process sensing measurement can be made immediately before the wafer 48 enters the process chamber 40. This sensing measurement gives access to the chamber condition and contaminant levels prior to process start. The presence of contaminants at this stage may indicate the need for chamber maintenance, and may impact deposited layer adhesion, coverage, and resistivity.

Third, an inter-process sensing measurement can be made after the wafer 48 enters the process chamber 40, but prior to the commencement of the process. This sensing measurement gives access to wafer-borne contamination.

Fourth, an inter-process sensing measurement can be used for feed-forward control. Feed-forward is a term that is generally used to identify the relationship between measurements made on the current process and a future process. The future process is adjusted to compensate for the outcome of the current process. Deposited layer adhesion or contact resistance are two examples of process characteristics that depended on prior process outcome. In the layer adhesion example, the surface roughness of the current layer can impact future layer adhesion. The surface roughness can be estimated via inter-process sensing. This information can be used to modify the future process, by extending the seed layer deposition time, for example.

An example embodiment of this invention was performed using an inter-process Residual Gas Analyzer (RGA), such as the Transpector HPR manufactured by Inficon, Inc., as the sensor in the reflow processing step that immediately follows Physical Vapor Deposition (PVD) of an Aluminum metal layer onto a wafer. It should be readily apparent that the preceding should not be limited to PVD processes and inter-process sensing can also be suitably conducted for etch, implant, furnace/diffusion, rapid thermal processing (RTP), atomic layer deposition (ALD), molecular beam (MB) or chemical vapor deposition (CVD) processing. In this example, the inter-process sensing measurements are used to estimate metal reflectivity via empirical modeling. As discussed above, the metal layer reflectivity is almost solely a function of conditions during the deposition of the final few monolayers. Although PVD is a mostly physical process, contaminants can have a significant detrimental impact on reflectivity. Accordingly, a chemical sensor that is exposed to the process conditions near the end of the reflow step should have a good chance of detecting contaminants that adversely affect reflectivity.

Since the precise mechanism relating RGA measurements to reflectivity is not known, an empirical model is used to fit the RGA measurements to ex situ metrology measurements of reflectivity. Once this fit has been optimized, the model can be applied directly to the RGA measurements in order to estimate reflectivity for all wafers, most of which are not directly measured by ex situ metrology.

While the present invention has been particularly shown and described with reference to the preferred mode as illustrated in the drawings, it will be understood by one skilled in the art that various changes in detail may be effected therein without departing from the spirit and scope of the invention.

PARTS LIST FOR FIGS. 1(a)-4

10 vacuum processing cluster tool
14 monitoring sensor
20 transfer chamber
30 process chamber
40 process chamber
44 slit valve
48 wafer (substrate)
60 valve
64 orifice
74 contaminants
78 process gases

We claim:

1. A method for monitoring a microelectronic manufacturing process on a processing apparatus, the apparatus including at least one processing chamber a transfer chamber interconnected to said at least one processing chamber and a first valve connecting said at least one processing chamber and said transfer chamber, said first valve being opened when transfer to and from said at least one processing chamber is taking place, the method comprising the steps of:
   providing a monitoring sensor in relation to, but not directly within the at least one processing chamber;
   detecting whether said first valve is opened or closed;
   permitting the monitoring sensor to access the interior of said at least one processing chamber only if it has been detected that said first valve is opened; and
   monitoring the interior of said at least one processing chamber for at least one process related parameter wherein
   said apparatus further includes a sensor protection mechanism interconnecting said monitoring sensor to said first valve to selectively protect the monitoring sensor from the environment of the interior of said at least one processing chamber to indicate an outcome based on interprocess activity on a substrate.

2. A method as recited in claim 1, wherein the monitoring sensor is connected to the at least one processing chamber by means of a second valve acting as said sensor protection mechanism, the method including the step of opening the second valve to permit the monitoring sensor to monitor the interior of the at least one processing chamber only after the first valve has been opened.

3. A method as recited in claim 1 wherein the monitoring sensor is interconnected to the interior of the at least one processing chamber, but the sensor protection mechanism prevents said monitoring sensor from being actively powered for monitoring until after the first valve has been opened.

4. A method as recited in claim 1, including the step of activating said monitoring sensor to monitor the interior of the at least one processing chamber prior to the insertion of a processing substrate therein from said transfer chamber.

5. A method as recited in claim 1, including the step of activating said monitoring sensor to monitor the interior of the at least one processing chamber immediately after a processing substrate has been transferred from said transfer chamber.

6. A method as recited in claim 1, including the step of activating said monitoring sensor to monitor the interior of the at least one processing chamber immediately after a process operation is complete and prior to transfer of said substrate from said at least one processing chamber.

7. A method as recited in claim 6, including the step of activating said monitoring sensor to monitor the interior of the at least one processing chamber after said substrate has been transferred from the at least one processing chamber.

8. A method as recited in claim 1, including the step of activating said monitoring sensor to monitor the interior of the at least one processing chamber after a first process operation when said first valve is opened.

9. A method as recited in claim 8, including the step of reconfiguring the process on a subsequent process operation based on results obtained from said monitoring step.

10. A microelectronic processing apparatus comprising:
  a transfer chamber;
  at least one processing chamber interconnected to said transfer chamber by a first valve in which at least one processing substrate is transferred between the at least one processing chamber and the transfer chamber for various process operations;
  means for detecting whether said first valve is opened or closed;
  a sensor protecting mechanism for selectively protecting the monitoring sensor from the environment of said processing chamber; and
  a monitoring sensor selectively interconnected with but not disposed within the interior of the at least one processing chamber, wherein said sensor protection mechanism permits said monitoring sensor access to monitor the interior of said monitoring chamber only after said detecting means has detected that the first valve has been opened.

11. A processing apparatus as recited in claim 10, wherein said monitoring sensor is interconnected to said at least one processing chamber by a second valve acting as said sensor protecting mechanism, said second valve being selectively opened to permit operation of said monitoring sensor only after the first valve has been opened.

12. A processing apparatus as recited in claim 10, wherein the monitoring sensor is directly interconnected to the interior of the at least one processing chamber, said monitoring sensor being connected to said apparatus so as not to be actively powered for monitoring until after the first valve has been opened.

13. A processing apparatus as recited in claim 10, in which said sensor protecting mechanism includes an orifice provided between the interior of the at least one processing chamber and the transfer chamber, wherein the size of the orifice can be varied from a smaller size when the first valve is not opened to a larger size, allowing access to the interior of the at least one processing chamber only after the first valve has been opened and isolating said monitoring sensor from the processing chamber when said orifice is of the smaller size to permit said monitoring sensor access to the interior of said at least one processing chamber when said orifice is opened to the larger size.

14. A processing apparatus as recited in claim 10, wherein said monitoring sensor is a mass spectrometer.

* * * * *

UNITED STATES PATENT AND TRADEMARK OFFICE
CERTIFICATE OF CORRECTION

PATENT NO. : 7,257,494 B2
APPLICATION NO. : 11/126471
DATED : August 14, 2007
INVENTOR(S) : Conner et al.

It is certified that error appears in the above-identified patent and that said Letters Patent is hereby corrected as shown below:

In the listing of the inventors on the Title page item 75, Craig Garvin's state of residence is incorrect. Please delete "NY" and replace with --MA--.

Signed and Sealed this

Second Day of September, 2008

JON W. DUDAS
*Director of the United States Patent and Trademark Office*